United States Patent
Haneda et al.

(10) Patent No.: US 8,003,518 B2
(45) Date of Patent: Aug. 23, 2011

(54) SEMICONDUCTOR DEVICE FABRICATION METHOD

(75) Inventors: Masaki Haneda, Kawasaki (JP); Noriyoshi Shimizu, Kawasaki (JP); Michie Sunayama, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 108 days.

(21) Appl. No.: 12/566,016

(22) Filed: Sep. 24, 2009

(65) Prior Publication Data

US 2010/0009530 A1    Jan. 14, 2010

Related U.S. Application Data

(63) Continuation of application No. PCT/JP2007/056368, filed on Mar. 27, 2007.

(51) Int. Cl.
*H01L 21/4763* (2006.01)
*H01L 21/311* (2006.01)
*H01L 21/44* (2006.01)

(52) U.S. Cl. ........ 438/627; 438/696; 438/652; 438/637

(58) Field of Classification Search .................. 438/627, 438/696, 652, 637
See application file for complete search history.

(56) References Cited

U.S. PATENT DOCUMENTS

| 5,969,422 | A  | * | 10/1999 | Ting et al. ...................... | 257/762 |
| 6,160,315 | A  | * | 12/2000 | Chiang et al. .................. | 257/762 |
| 6,249,055 | B1 | * | 6/2001  | Dubin ............................ | 257/758 |
| 6,265,305 | B1 | * | 7/2001  | Tsou et al. ..................... | 438/628 |
| 6,930,035 | B2 | * | 8/2005  | Sakata .......................... | 438/622 |
| 2007/0020931 | A1 | * | 1/2007 | Koura et al. .................. | 438/687 |

FOREIGN PATENT DOCUMENTS

| JP | 2005-277390 A | 10/2005 |
| JP | 2007-12996 A  | 1/2007  |
| JP | 2007-59660 A  | 3/2007  |
| JP | 2007-67107 A  | 3/2007  |

OTHER PUBLICATIONS

International Search Report for PCT/JP2007/056368, mailing date of Jun. 12, 2007.

* cited by examiner

*Primary Examiner* — Luan C Thai
(74) *Attorney, Agent, or Firm* — Westerman, Hattori, Daniels & Adrian, LLP

(57) ABSTRACT

A semiconductor device fabrication method including the steps of: forming an interlayer insulating film on a substrate; forming an opening in the interlayer insulating film; forming an alloy layer containing manganese and copper to cover the inner surface of the opening; forming a first copper layer of a material containing primarily copper on the alloy layer to fill the opening; forming, on the first copper layer, a second copper layer of a material containing primarily copper and a higher concentration of oxygen, carbon or nitrogen than the first copper layer; heating the substrate on which the second copper layer has been formed; and removing the second copper layer.

18 Claims, 14 Drawing Sheets

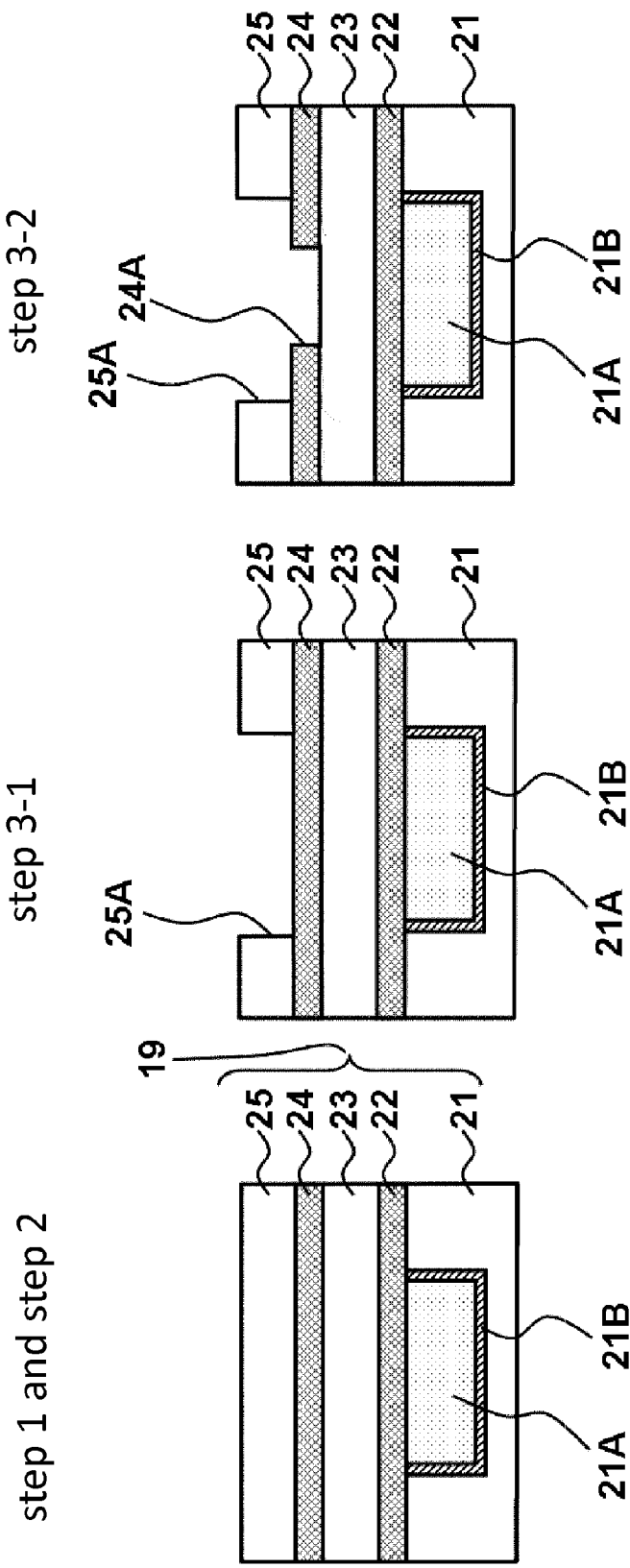

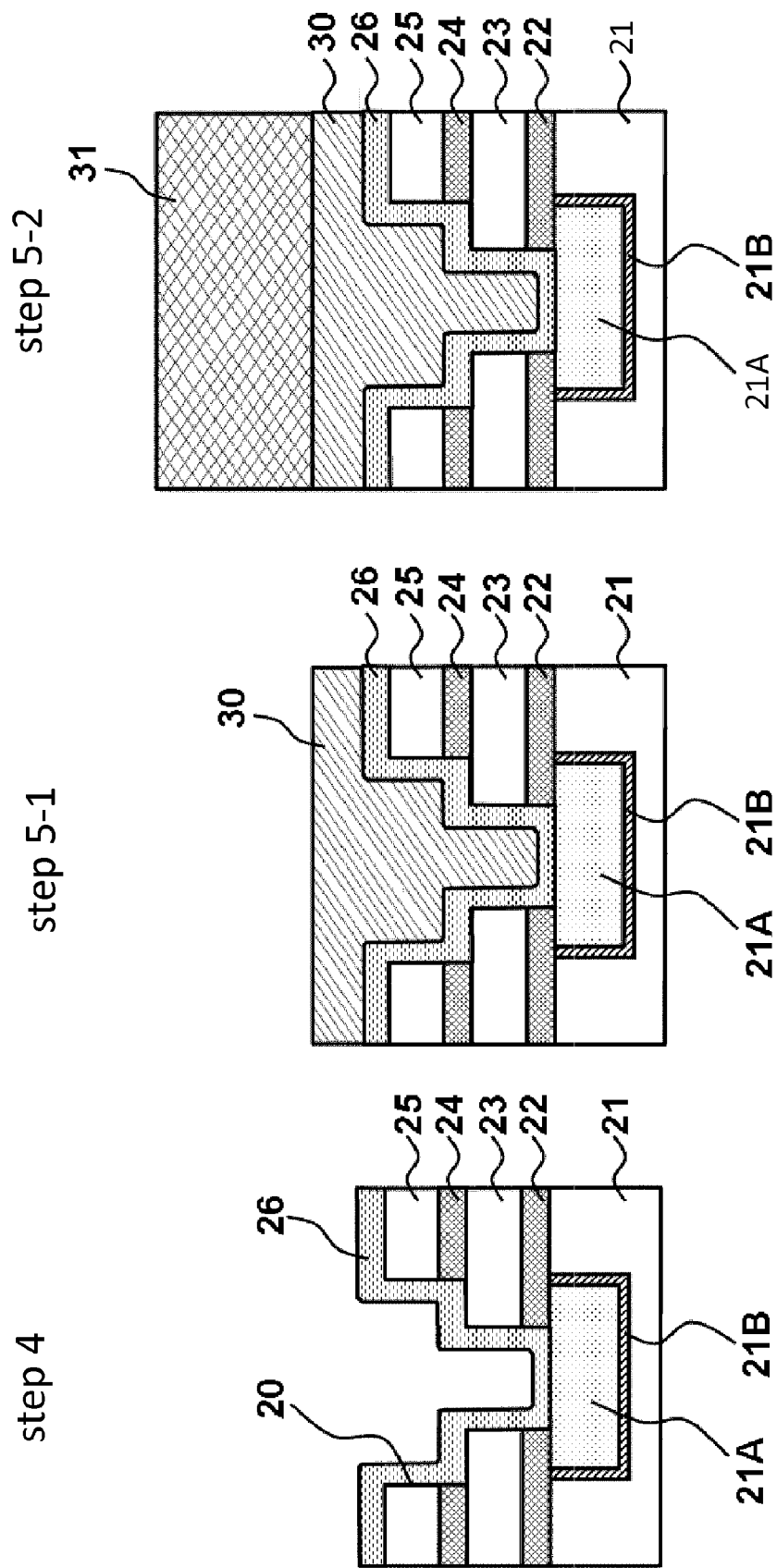

step 6 step 7 step 6 step 7

FIG. 13
chemical formula: $(CH_3)_3SiC_2H_3Cu(I)CF_3COCHCF_3$
Trimethylvinylsilane (TMVS)
$C_5H_{12}Si$
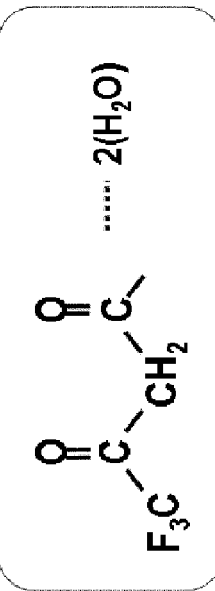
Hexafluoroacetylacetone (Hhfac)
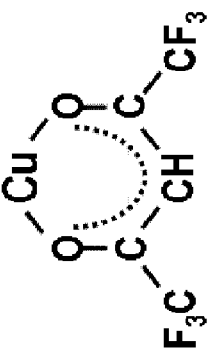
····· $2(H_2O)$
structural formula:
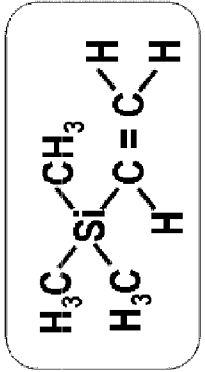
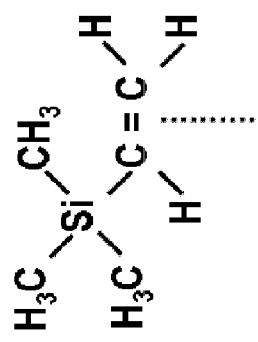

SEMICONDUCTOR DEVICE FABRICATION METHOD

CROSS REFERENCE TO RELATED APPLICATION

This application is a continuation of International application NO. PCT/JP2007/056368 filed on Mar. 27, 2007, the entire contents of which are incorporated herein by reference.

FIELD

The embodiments discussed herein are relates to a method for fabricating a semiconductor device having a Cu interconnection structure capable of fast signal transmission.

BACKGROUND

In order to solve the problem of signal delay in semiconductor devices such as Large Scale Integration (LSI) devices used in information communication apparatuses, low-dielectric-constant films (so-called low-k films) are used as interlayer insulating films, and interconnection structures using copper (Cu), which has low electrical resistivity, as the material of interconnects and interconnect vias have been developed. In such an interconnection structure, it is common practice to cover interconnects with a barrier film containing a high-melting-point metal in order to prevent Cu atoms from diffusing into the interlayer insulating film.

Miniaturization of interconnection structures, among other factors, has aroused a demand for formation of a barrier film having a uniform thickness of several nanometers. However, it is difficult to uniformly form such a thin film by current Physical Vapor Deposition (PVD) and Chemical Vapor Deposition (CVD) methods. Semiconductor devices having Cu interconnection structures in which barrier films are formed by these techniques may not provide a high degree of reliability. Therefore, as an alternative to these methods, a technique has been proposed in which a Cu alloy is used as the interconnect material and an element in the alloy is caused to react with an element in an interlayer insulating film during a heating process to form a Cu diffusion barrier film.

[Patent Document 1]
Japanese Patent Laid-Open No. 2005-277390

In the method described in Patent Document 1, an alloy of Cu and another metal (added metal) is formed on the surface of an interconnect trench formed in an interlayer insulating film. Then, the added metal is diffused by heating to form a Cu diffusion barrier film. The metal added to Cu is a metal such as manganese (Mn) that has a high oxidation tendency and diffuses more readily than Cu. By using the method, a diffusion barrier film having a composition of $MnSi_xO_y$ is formed at the interface between the Cu layer and the interlayer insulating film in a self-aligned manner.

However, if a Cu diffusion barrier layer is formed by the method disclosed in Patent Document 1, the concentration of an added metal such as Mn remaining in Cu interconnections needs to be low in order to keep the resistance of the Cu interconnections low.

SUMMARY

According to one aspect of the present invention, the present invention is characterized by including the steps of: forming an interlayer insulating film on a substrate; forming an opening in the interlayer insulating film; forming an alloy layer containing manganese and copper to cover the inner surface of the opening; forming a first copper layer of a material containing primarily copper on the alloy layer to fill the opening; forming, on the first copper layer, a second copper layer of a material containing primarily copper and a higher concentration of oxygen, carbon or nitrogen than the first copper layer; heating the substrate on which the second copper layer has been formed; and removing the second copper layer.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF DRAWINGS

FIGS. 5A to 5C are cross-sectional views (the first series) illustrating process steps of a method for forming a Cu interconnection according to a first exemplary embodiment;

FIGS. 7F to 7H are cross-sectional views (the third series) illustrating process steps of the method for forming the Cu interconnection according to the first exemplary embodiment;

FIG. 13 illustrates the chemical formula of a source used in CVD according to the first exemplary embodiment.

DESCRIPTION OF EMBODIMENTS

Embodiments of the present invention will be described below in detail with reference to drawings. The present embodiments are only illustrative. The present invention is not limited to configurations illustrated in the embodiments.

Figure 1:
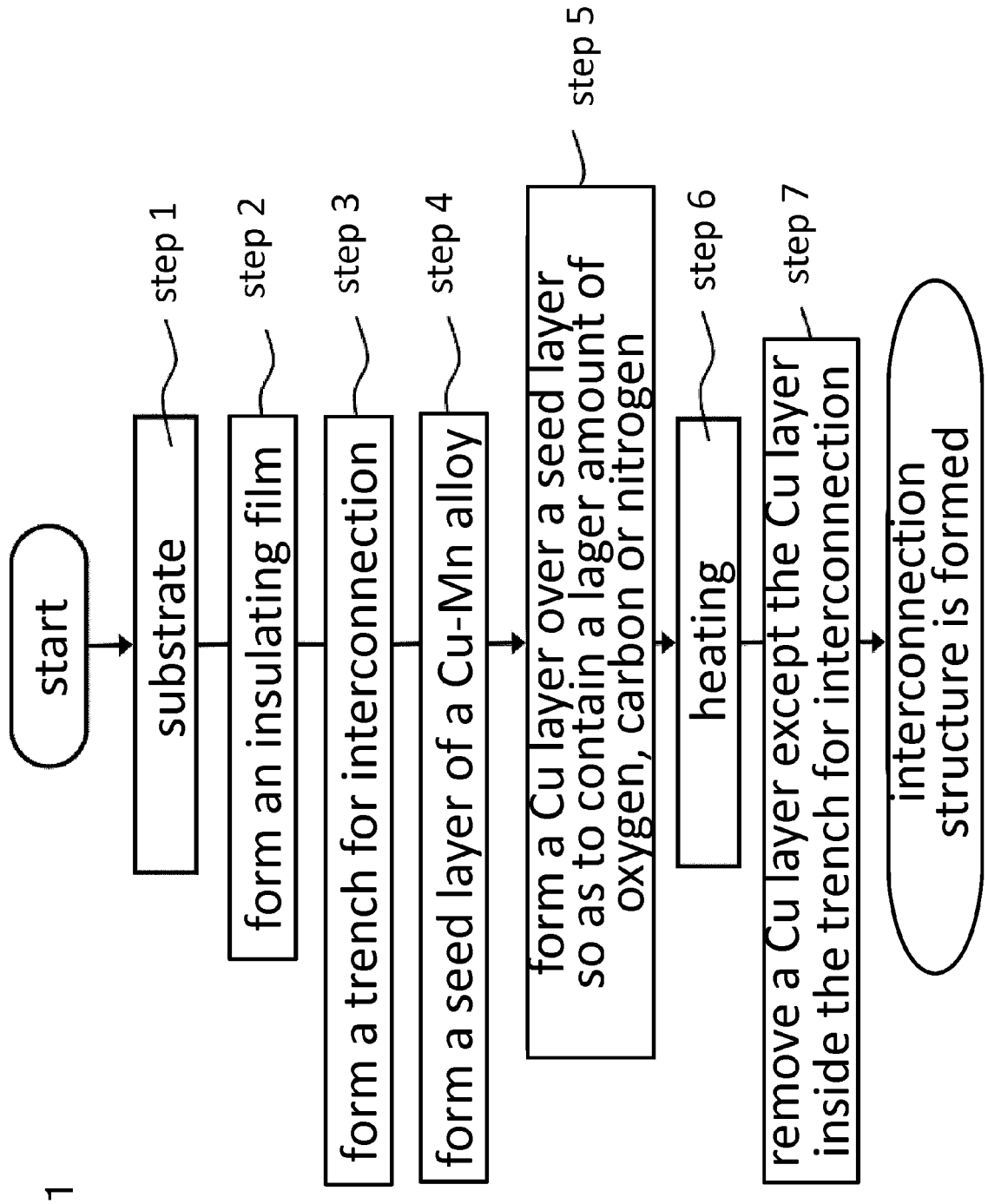
FIG. 1 is a flowchart schematically illustrating a process of forming a Cu interconnection structure.

An overview of a fabrication process according to the present embodiments will be described first. FIG. 1 is a flowchart outlining a process for forming a Cu interconnection structure. As illustrated in the flowchart, a substrate such as a silicon wafer is provided first (step 1) and an interlayer insulating film is formed on the substrate (step 2). Then, an interconnect trench is formed in the interlayer insulating film (step 3). In the interconnect trench formed at step 3, a seed layer of a Cu—Mn alloy is formed (step 4). Then, a Cu layer is formed over the seed layer. Another Cu layer containing a larger amount of oxygen (O), carbon (C) or nitrogen (N) is formed above, that is, outside the interconnect trench (step 5). Then, the substrate is heated to form a barrier film and diffuse remaining Mn atoms into the Cu layer (step 6). The Cu layer except the portion inside the interconnect trench is removed (Step 7). As a result of these steps, a Cu interconnection structure with low Mn concentration is formed.

Figure 2:
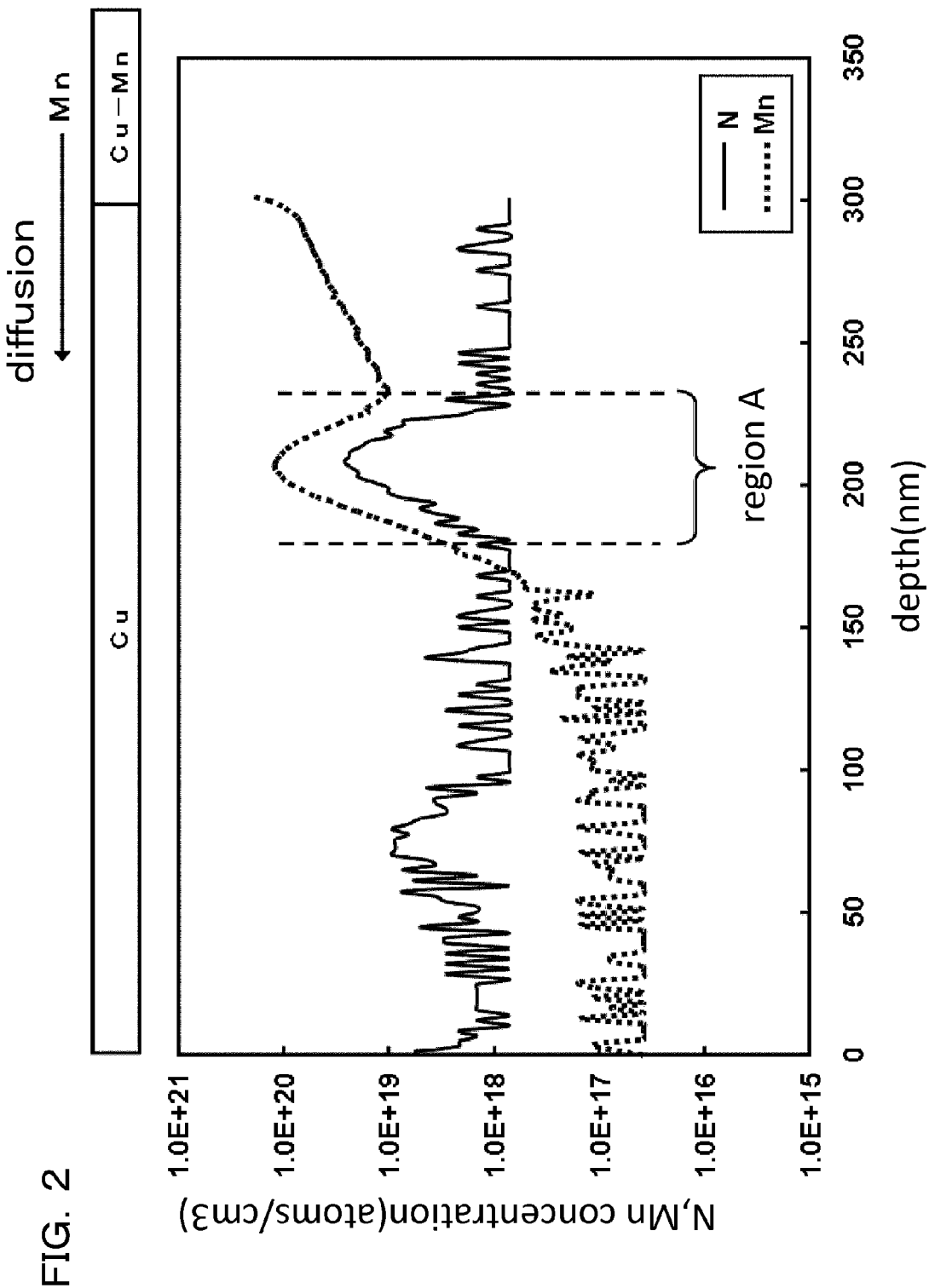
FIG. 2 is a graph illustrating concentration distributions of N and Mn.
Figure 3:
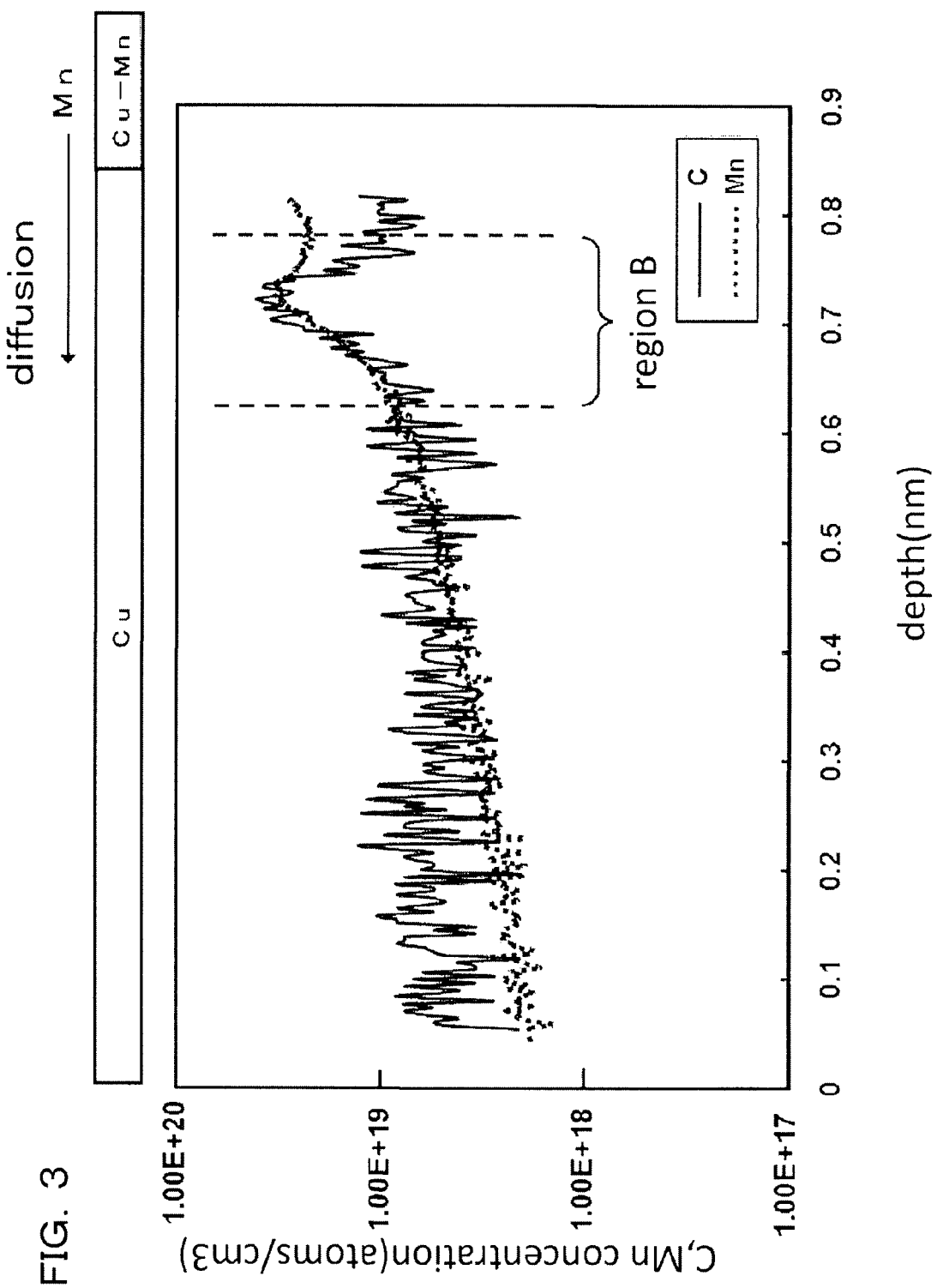
FIG. 3 is a graph illustrating concentration distributions of C and Mn.
Figure 4:
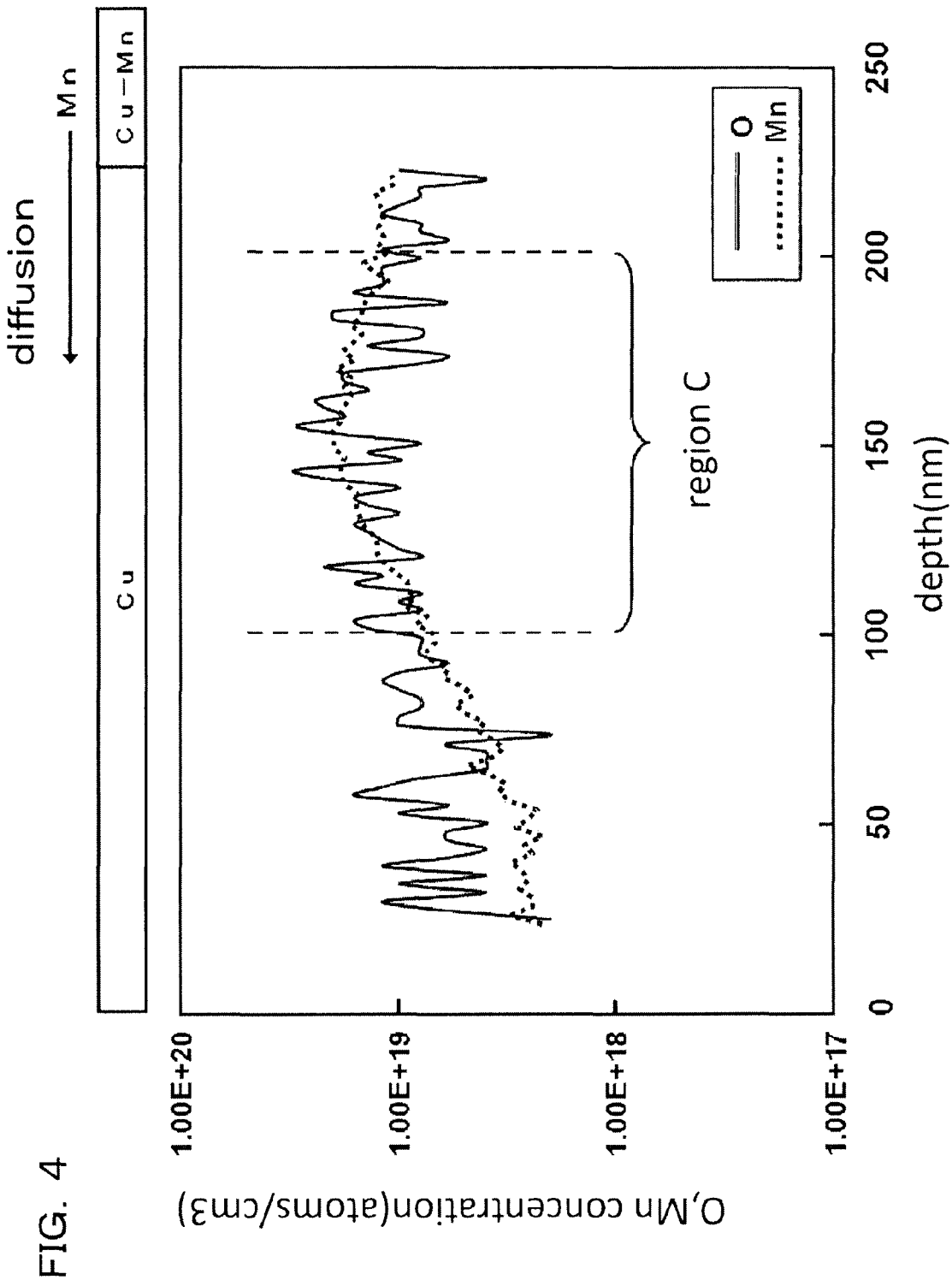
FIG. 4 is a graph illustrating concentration distributions of O and Mn.

The present inventors have focused attention on the relationship between the amount of oxygen (O), carbon (C) or nitrogen (N) and the amount of Mn contained in Cu interconnects and have found that a significant amount of Mn segregates in regions where a significant amount of oxygen (O), carbon (C) or nitrogen (N) segregates. FIG. 2 to 4 are graphs illustrating the concentration distributions of nitrogen (N), carbon (C), oxygen (O), and Mn in a Cu—Mn alloy layer formed by a conventional technique which were determined using Secondary Ion-microprobe Mass Spectrometry (SIMS).

The horizontal axis of the graph of FIG. 2 represents depth and the vertical axis represents the concentrations of N and Mn. In the graph, the concentration of N is represented by the solid curve and the concentration of Mn is represented by the dotted curve. It is seen from the graph that the N and Mn concentrations are locally high in region A.

The horizontal axis of the graph of FIG. 3 represents depth and the vertical axis represents the concentrations of C and Mn. In the graph, the concentration of C is represented by the solid curve and the concentration of Mn is represented by the dotted curve. It is seen from the graph that the C and Mn concentrations are locally high in region B.

The horizontal axis of the graph of FIG. 4 represents depth and the vertical axis represents the concentrations of O and Mn. In the graph, the concentration of O is represented by the solid curve and the concentration of Mn is represented by the dotted curve. It is seen from the graph that the O and Mn concentrations are locally high in region C.

As just described, the concentration of Mn is high in regions of the Cu layer where a large amount of oxygen (O), carbon (C) or nitrogen (N) is contained. While the reason why this phenomenon occurs has not entirely been clarified, probably Mn was attracted by oxygen, (O), carbon (C) or nitrogen (N) contained in the Cu layer 27. In order to make use of the phenomenon to efficiently remove Mn from Cu interconnects, a Cu layer on a seed layer is formed as described below in first to third exemplary embodiments. After a first Cu layer is formed in an interconnect trench, a second Cu layer is formed on the first Cu layer under such conditions that a larger amount of oxygen (O), carbon (C) or nitrogen (N) is added to the second layer 2 than to the first Cu layer, and is then heated. With this method, a larger amount of Mn may be intentionally segregated in the second Cu layer containing a larger amount of oxygen (O), carbon (C) or nitrogen (N). Then, the second Cu layer is removed to reduce the amount of Mn contained in the interconnect trench, that is, in the Cu interconnect.

A first exemplary embodiment will be described with respect to an example in which Cu is deposited by electroplating to form a first Cu layer in an interconnect trench, then the current density which is a condition under which the electroplating is performed is changed to form a second Cu layer that contains a larger amount of oxygen (O), carbon (C) or nitrogen (N) than the first Cu layer on the first Cu layer. The first exemplary embodiment will be described with respect to another example as well in which the second Cu layer is formed by using CVD.

In a second exemplary embodiment, a first Cu layer is formed in an interconnect trench by electroplating and then a second Cu layer containing a larger amount of oxygen (O), carbon (C) or nitrogen (N) than the first Cu layer is formed on the first Cu layer by Cu sputtering using a gas such as CO, $CO_2$, or $N_2$.

In a third exemplary embodiment, a Cu layer is formed inside and outside an interconnect trench by electroplating and then oxygen (O), carbon (C) or nitrogen (N) is incorporated into the surface of the Cu layer.

In any of the present embodiments, the first Cu layer may be formed by sputtering or CVD as well. However, electroplating is more preferable than these methods in order to fill minute interconnect trenches with Cu. Therefore, the exemplary embodiments will be described with respect to an implementation in which electroplating is used to form the first Cu layer.

First Exemplary Embodiment

A method for forming a Cu interconnection structure according to the first exemplary embodiment will be described. In the first exemplary embodiment, as stated above, Cu is deposited by electroplating to form a first Cu layer in an interconnect trench and then the current density, which is a condition under which electroplating is performed, is changed to form a second Cu layer containing a larger amount of oxygen (O), carbon (C) or nitrogen (N) than the first Cu layer on the first Cu layer. Another example will also be described in which the second Cu layer is formed by using CVD. FIGS. 5 to 8 are cross-sectional views illustrating process steps of the method for forming a Cu interconnect according to the first exemplary embodiment.

Steps 1 and 2

In these steps, interlayer insulating films 19 (interlayer insulating films 21 to 25) are formed on a substrate, not illustrated. The substrate may be a silicon substrate such as a silicon wafer. FIG. 5A is a cross-sectional view of a semiconductor device formed through steps 1 and 2 of the first exemplary embodiment. In particular, first an interlayer insulating film 21 is formed on the substrate. A Cu interconnect 21A is embedded in the interlayer insulating film 21 with a barrier metal film 21B of tantalum (Ta) or tantalum nitride (TaN) between them. The width of the Cu interconnect 21A is 500 nm, for example.

Then, an etching stopper film 22 of silicon carbide (SiC) or silicon nitride (SiN) is formed on the interlayer insulating film 21. An interlayer insulating film 23 is formed on the etching stopper film 22 to a thickness in the range of 100 to 300 nm. An etching stopper film 24 of silicon carbide (SiC) or silicon nitride (SiN) is formed on the interlayer insulating film 23 and an interlayer insulating film 25 is formed on the etching stopper film 24 to a thickness in the range of 100 to 300 nm. The interlayer insulating films 23 and 25 contain Si and O and are low-k insulating film of a low-dielectric-constant material such as $SiO_2$ or SiOF. The etching stopper films 22 and 24 are formed by plasma CVD.

Step 3

In this step, an interconnect trench 20 is formed in the interlayer insulating films 19 (the etching stopper films 22 and 24 and the interlayer insulating films 23 and 25) formed on the substrate in step 2 (step 3-1). FIGS. 5B to 6E are cross-sectional views of the semiconductor device formed through step 3 of the first exemplary embodiment.

In particular, first an interconnect trench 25A is formed to expose the etching stopper film 24 as illustrated in FIG. 5B (step 3-1). The width of the interconnect trench 25A is 500 nm, for example.

Then, an opening 24A is formed in the exposed etching stopper film 24 as illustrated in FIG. 5C (step 3-2). The opening 24A is formed so that the interlayer insulating film 23 is exposed. The diameter of the opening 24A is 70 nm, for example.

Figures 6D, 6E:
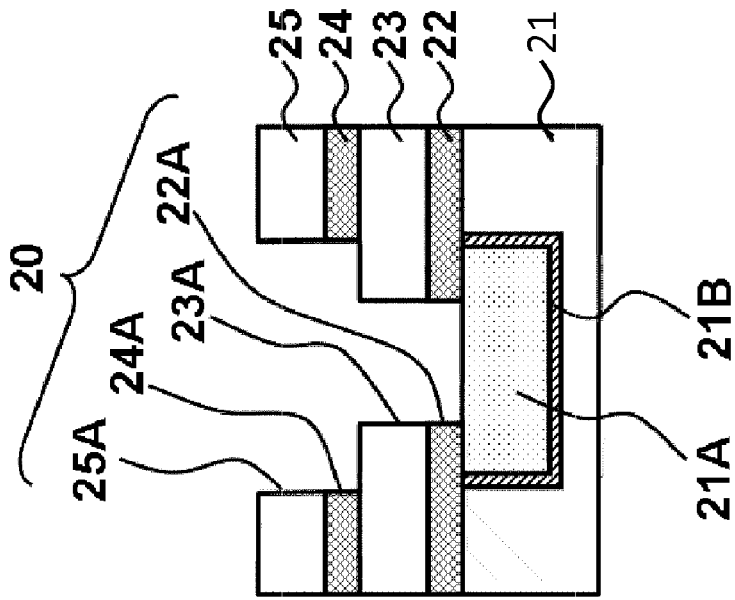
FIGS. 6D and 6E are cross-sectional views (the second series) illustrating process steps of the method for forming the Cu interconnection according to the first exemplary embodiment.

Then, an opening 23A is formed in the exposed interlayer insulating film 23 as illustrated in FIG. 6D (Step 3-3). The opening 23A is formed so that the etching stopper film 22 is exposed. The diameter of the opening 23A is 65 nm, for example.

An opening 22A is formed in the exposed etching stopper film 22 as illustrated in FIG. 6E (step 3-4). The opening 22A is formed so that the Cu interconnect 21A is exposed. Concurrently with the removal of the exposed portion of the etching stopper film 22, the exposed portion of the etching stopper film 24 is also removed as illustrated in FIG. 6E.

Step 4

In this step, a Cu—Mn alloy layer 26 is formed to cover the interconnect trench 20 (the interconnect trench 25A and opening 22A to 24A) formed at step 3. The Cu—Mn alloy layer 26 contains copper and manganese. FIG. 7F is a cross-sectional view of the semiconductor device formed through step 4 of the first exemplary embodiment. The Cu—Mn alloy layer 26 covers the bottom and sidewalls of the interconnect trench 20 and functions as a seed layer as well. The Cu—Mn alloy layer 26 contains, for example, 0.1 to 10 at % of Mn and is a film that contiguously covers the bottom and sidewalls of the interconnect trench 25A and the bottom and sidewalls of the opening 22A to 24A. The Cu—Mn alloy layer 26 is for example 10 to 80 nm in thickness and is formed by sputtering, for example. The Cu—Mn alloy layer 26 may be formed by CVD or Atomic Layer Deposition (ALD) as well.

Step 5

In this step, electroplating is used to form Cu layers 30 and 31 (first and second copper layers) on the Cu—Mn alloy layer 26 formed on the substrate to fill the interconnect trench 20. FIGS. 7G and 7H are cross-sectional views of the semiconductor device formed through step 5 of the first exemplary embodiment. Both Cu layers 30 and 31 contain primarily of copper (Cu).

The electroplating in step 5 is performed for example as follows. The Cu—Mn alloy layer 26 formed on the substrate is used as the cathode and a voltage is applied between the Cu—Mn alloy layer 26 and the other electrode, namely the anode. The current density (across the electrodes) in forming the Cu layer 30 is set to 49.7 mA/cm$^2$, for example, and the current density in forming the Cu layer 31 is set to 3.3 mA/cm$^2$, for example. If formation of the Cu layers 30 and 31 is performed continuously, the current density setting is changed during the formation. With these current density settings, the Cu layer 31 formed will contain approximately 10 to 15 times more oxygen (O), carbon (C) or nitrogen (N) than the Cu layer 30.

Figure 14:
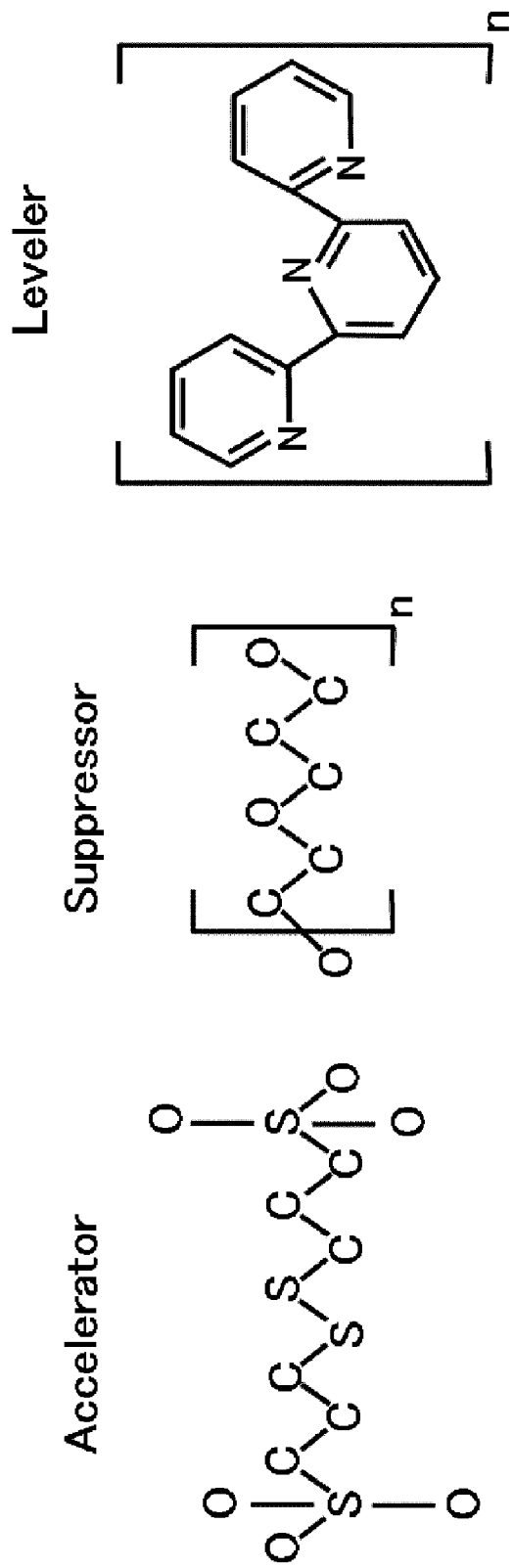
FIG. 14 illustrates the chemical formulae of additives used in electroplating.

The plating solution used in the electroplating contains predetermined amounts of ions of materials such as copper ions and chloride ions. Additives used in the electroplating includes predetermined amount of an accelerator, suppressor and leveler. Exemplary materials of the additives are illustrated in FIG. 14. FIG. 14 illustrates the chemical formulae of additives that may be used in electroplating. As illustrated in FIG. 14, the accelerator may be a sulfuric compound that contains primarily of carbon (C), oxygen (O) and sulfur (S). The suppressor may be a compound that contains primarily of carbon (C) and oxygen (O). The leveler may be a methylamine compound that contains primarily of carbon (C), hydrogen (H) and nitrogen (N).

The voltage may be applied before the substrate is immersed in the plating solution (hot entry) or after the immersion (cold entry). Examples of hot entry methods include:

Potentiostatic entry, in which current is controlled to keep the current density approximately constant while the substrate is immersed in the solution.

Triggered entry, in which a minute voltage (for example 0.25 V) is applied between the substrate and the anode and then the substrate is immersed. After the voltage drops, the voltage is held for a predetermined time period. Then a voltage is applied so that a predetermined current density is reached.

Ramped entry, in which a minute voltage (for example 0.25 V) is applied between the substrate and the anode and then the substrate is immersed. After the voltage drops, the voltage is held for a predetermined time period. Then a voltage is linearly applied until a predetermined current density is reached.

As mentioned above, the Cu layer 31 may be formed by CVD. In that case, the stage temperature in the CVD system is set to a value in the range of 100° C. to 300° C., for example. In particular, the temperature in the CVD system is preferably set to approximately 200° C. The Cu source used in the CVD may be a Cu organic compound described below.

FIG. 13 illustrates the chemical formula of a source used in the CVD. As illustrated in FIG. 13, for example Trimethylvinylsilyl hexafluoroacetylacetonate Cu (I) is used as the source in the CVD. The material is abbreviated as Cu (hfac) tmvs. In the CVD, gas of the source is introduced in a CVD system at a rate of 0.2 g/min to form a Cu layer 31. The pressure in the CVD system during forming the Cu layer 31 is set to between 10 to 1000 Pa, for example. An optimum pressure value is approximately 100 Pa. The carrier gas used is 500 sccm of argon (Ar), for example. TMVS in FIG. 13 is a reaction control agent that controls reaction to prevent Cu from reacting in the storage tank before being deposited. Hhfac in FIG. 13 is a reaction control agent that accelerates reaction during deposition.

In this way, CVD is performed by using Trimethylvinylsilyl hexafluoroacetylacetonate Cu (I) as the source in this step. Accordingly, more element such as oxygen (O), carbon (C) or nitrogen (N) may be injected into the Cu layer 31 than in the Cu layer 30. Of course, other organic material may be used as the source of Cu.

Step 6

Figure 8J:
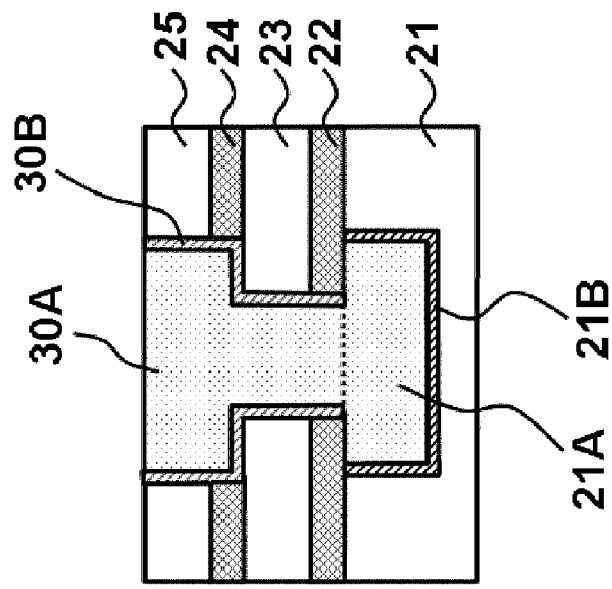
FIGS. 8I to 8J are cross-sectional views (the fourth series) illustrating process steps of the method for forming the Cu interconnection according to the first exemplary embodiment.
Figure 8I:
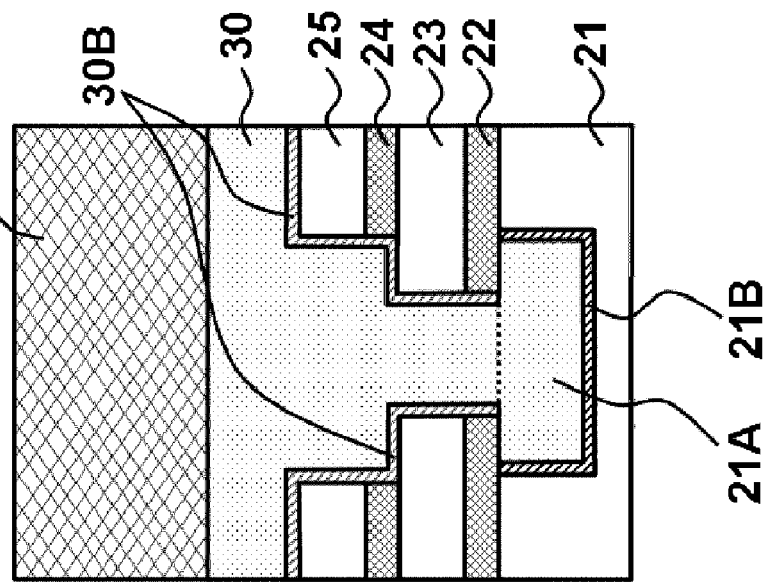

In this step, the substrate on which the Cu layers 30 and 31 have been formed is heated. FIG. 8I is a cross-sectional view of the semiconductor device formed through step 6 of the first exemplary embodiment. In particular, the substrate on which the Cu layers 30 and 31 have been formed is heated at a temperature in the range, for example, from 250° C. to 400° C. inclusive for approximately 30 minutes. Here, the substrate on which the Cu layers 30 and 31 have been formed is heated in an atmosphere of hydrogen or an inactive gas such as nitrogen or argon. A strongly acidic gas such as formic acid may be used in the heating.

By heating the substrate in this way, Mn in the Cu—Mn alloy layer 26 reacts with Si and O in the etching stopper films 22 and 24 and the interlayer insulating films 23 and 25. During this reaction, Cu does not react with Si and O because the Mn has an ionization tendency (oxidation tendency) much higher than that of Cu. Consequently, a diffusion barrier film 30B of a composition $MnSi_xO_Y$ is formed on the surface of the interconnect trench 20. The formation of the film is sometimes called self-formation.

The etching stopper films 22 and 24 are made of a material containing primarily of silicon carbide (SiC) or silicon nitride (SiN). These films also contain a small amount of oxygen and therefore the diffusion barrier film 30B of the composition $MnSi_xO_Y$ is also formed on the exposed regions of the etching stopper films 22 and 24.

Prior to step 4, preferably the Cu interconnect 21A is reverse-sputtered to remove a native oxide film formed on the surface of the Cu interconnect 21A. This process ensures a good contact between the Cu interconnect 21A and the Cu layer 30. The reverse sputtering here is a process that bombards a metal surface of interest with an argon (Ar) plasma or the like to remove a native oxide film from the metal surface.

On the other hand, Mn atoms remaining in the Cu-Mu alloy layer 26 without reacting with Si and O in the interlayer insulating film 23 diffuse into the Cu layers 30 and 31. As Mn atoms diffuse, the boundary between the Cu-Mu alloy layer 26 and the Cu layer 30 disappears as illustrated in FIG. 8I.

As Mu atoms diffuse into the Cu layers 30 and 31 by the heating as described above, the concentration of Mn in the Cu layer 31 increases due to a large amount of oxygen (O), carbon (C) or nitrogen (N) contained in the Cu layer 31.

Step 7

In this step, an unwanted portion of the Cu layer 30 that was deposited on the interlayer insulating film 25 and the Cu layer 31 are removed by using CMP, for example. FIG. 8J is a cross-sectional view of the semiconductor device formed through step 7 of the first exemplary embodiment. As illustrated in FIG. 8J, together with the portion of the Cu layers 30 and the Cu layer 31, the portion of the diffusion barrier film 30B that was deposited on the interlayer insulating film 25 is also polished to expose the surface of the interlayer insulating film 25.

Because Mn atoms diffuse into the Cu layer 31 as described above, the concentration of Mn in the portion of the Cu layers 30 and 31 that is inside the interconnect trench 20 decreases and the concentration of Mn in the portion outside the interconnect trench 20 increases. Because the portion outside the interconnect trench 20 is removed after the concentration of Mn inside the interconnect trench 20 has decreased, the concentration of Mn in the interconnect 30A decreases. As a result, the resistance of the interconnect 30A is reduced and a Cu interconnection structure capable of fast transmission is formed.

Second Exemplary Embodiment

A method for forming a Cu interconnection structure according to the second exemplary embodiment will be described. In the second exemplary embodiment, a first Cu layer is formed in an interconnect trench by electroplating as describe above and then a second Cu layer that contains a larger amount of oxygen (O), carbon (C) or nitrogen (N) than the first Cu layer is formed on the first Cu layer by Cu sputtering in a sputtering system in which a gas such as CO, $CO_2$, $N_2$ gas is introduced. FIGS. 9 and 10 are cross-sectional views of process steps of the method for forming a Cu interconnect according to the second exemplary embodiment.

Steps 1 to 4 of the second exemplary embodiment are the same as those of the first exemplary embodiment and therefore the description of which will be omitted.

Step 5

Figure 9H:
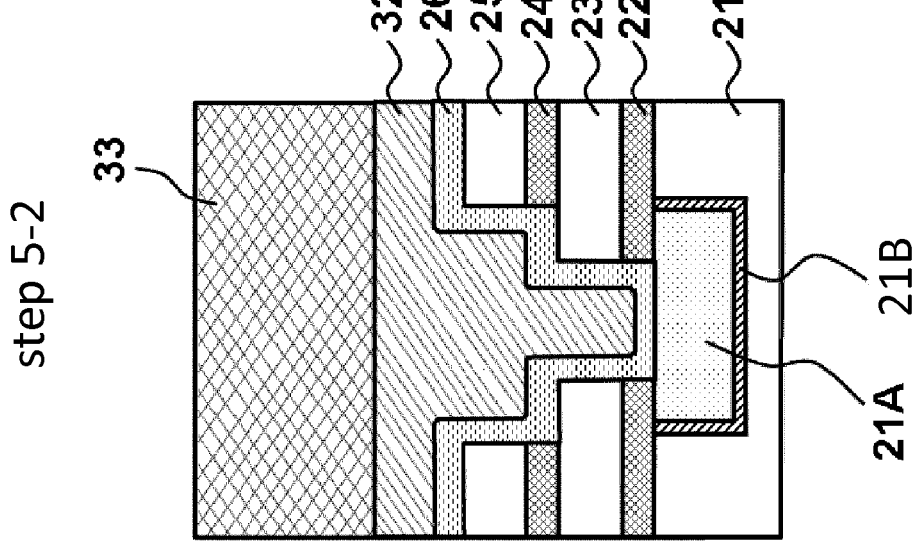
FIGS. 9G and 9H are cross-sectional views (the first series) illustrating process steps of a method for forming a Cu interconnection according to a second exemplary embodiment.
Figure 9G:
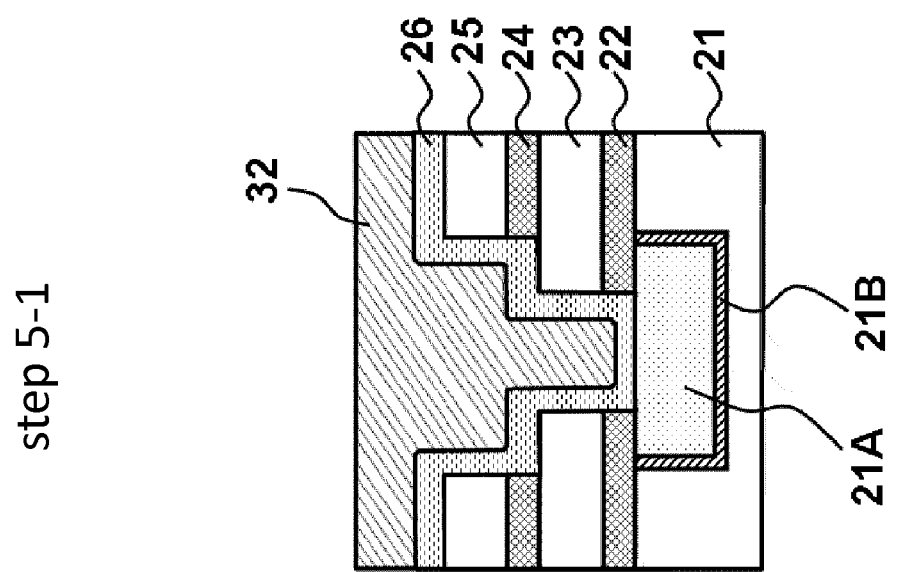

In this step, on the substrate on which a Cu—Mn alloy layer 26 has been formed, a Cu layer 32 (a first copper layer) is formed by electroplating to fill an interconnect trench 20 and then another Cu layer 33 (a second copper layer) is formed by sputtering. FIGS. 9G and 9H are cross-sectional views of a semiconductor device formed through step 5 of the second exemplary embodiment.

The Cu layer 32 is formed by electroplating in the same way as that of the first exemplary embodiment. That is, the current density is set to 49.7 $mA/cm^2$, for example.

Then, the Cu layer 33 is formed on the Cu layer 32 by sputtering. The sputtering in this step is performed in a sputtering system in which a gas such as CO, $CO_2$, $O_2$, $N_2$, or $NO_2$ is introduced. By sputtering in an atmosphere containing oxygen (O), carbon (C) or nitrogen (N) in this way, C, N or O is incorporated into the Cu layer 33. The flow rate of the gas to be introduced is set to 5 sccm, for example. By forming the Cu layers 32 and 33 with such setting, the amount of oxygen (O), carbon (C) or nitrogen (N) incorporated into the Cu layer 33 will be larger than that in the Cu layer 32 by a factor of approximately 10 to 15.

The use of sputtering as described above has the following advantages.

1. The type of element to be incorporated in the Cu layer may be controlled by changing the composition of gas introduced into the sputtering system.
2. The amount of the element to be incorporated into the Cu layer may be controlled by controlling the flow rate of the gas introduced in the sputtering system.

Step 6

Figure 10I:
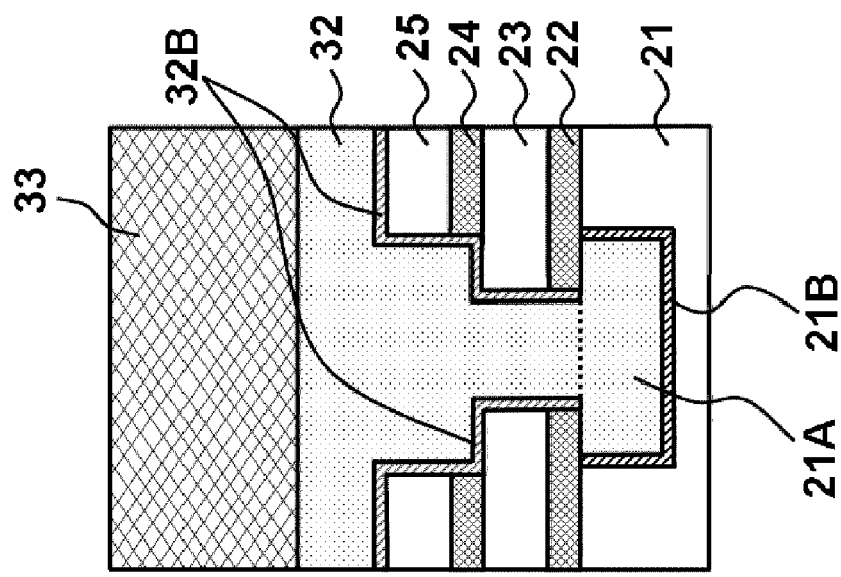
FIGS. 10I and 10J are cross-sectional views (the second series) illustrating process steps of the method for forming the Cu interconnection according to the second exemplary embodiment.

In this step, the substrate on which the Cu layers 32 and 33 have been formed as illustrated in FIG. 10I is heated in the same method as that in the first exemplary embodiment.

Step 7

Figure 10J:
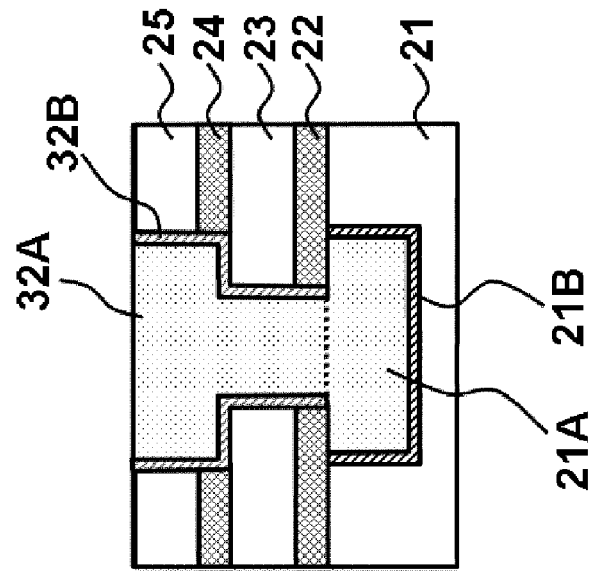

In this step, an unwanted portion of the Cu layer 32 deposited on the interlayer insulating film 25 and the Cu layer 33 are removed as illustrated in FIG. 10J in the same method as that in the first exemplary embodiment.

Third Exemplary Embodiment

A method for forming a Cu interconnection structure according to the third exemplary embodiment will be described. In the third exemplary embodiment, a Cu layer is formed inside and outside an interconnect trench by electroplating as described above. Then, ions of oxygen (O), carbon (C) or nitrogen (N) are implanted in the surface of the Cu layer, or the surface of the Cu layer is exposed to a gas containing oxygen (O), carbon (C) or nitrogen (N) to introduce oxygen (O), carbon (C) or nitrogen (N) into the surface of the Cu layer. FIGS. 11 and 12 are cross-sectional views illustrating process steps of the method for forming a Cu interconnect according to the third exemplary embodiment. Steps 1 through 4 of the third exemplary embodiment are the same as those of the first exemplary embodiment and therefore description of which will be omitted.

Step 5

In this step, on a Cu-Mu alloy layer 26 formed on the substrate, a Cu layer 34 (a first copper layer) is formed by electroplating to fill an interconnect trench 20. The Cu layer 34 here is formed by electroplating with a current density of 49.7 $mA/cm^2$, for example. Then, oxygen (O), carbon (C) or nitrogen (N) is introduced into the surface of the Cu layer 34.

Figure 11H:
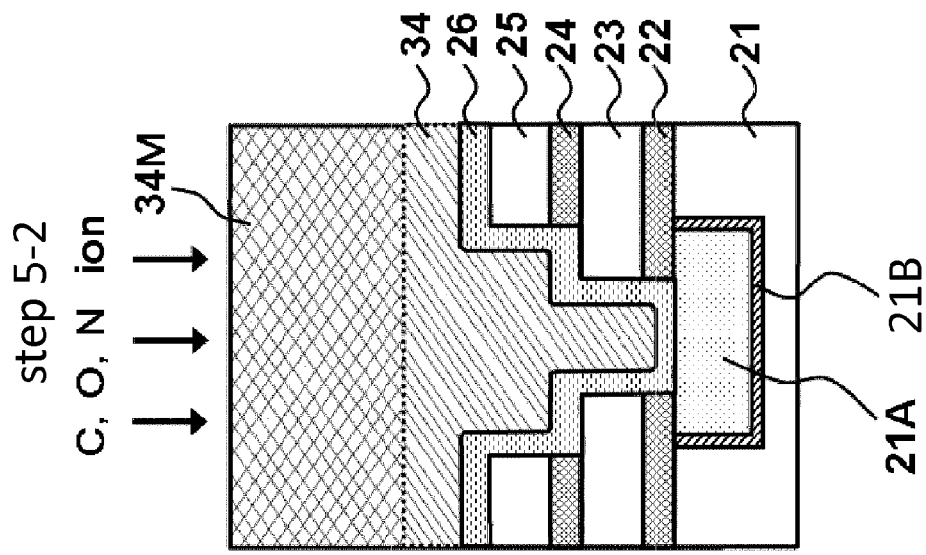
FIGS. 11G and 11H are cross-sectional views (the first series) illustrating process steps of a method for forming a Cu interconnection according to a third exemplary embodiment.
Figure 11G:
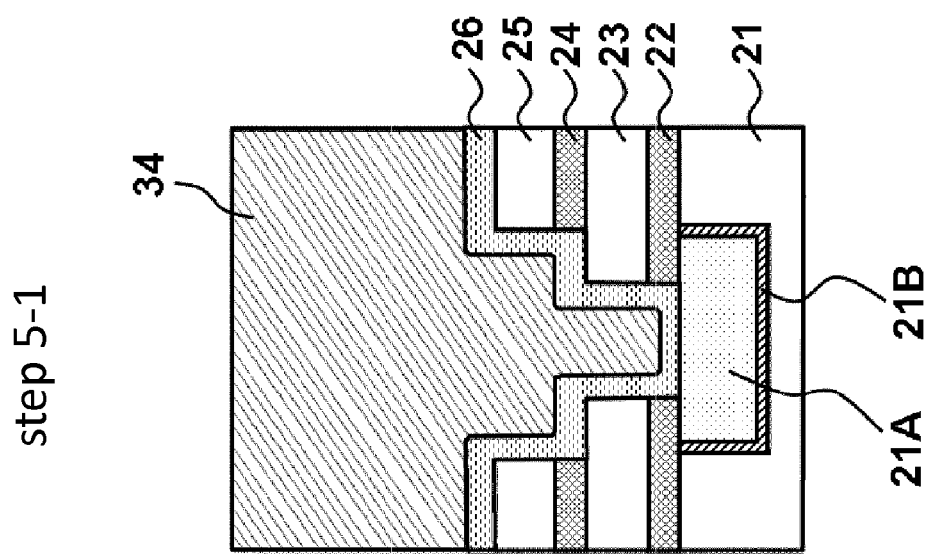

FIGS. 11G and 11H are cross-sectional view of a semiconductor device formed through step 5 of the third exemplary embodiment.

The introduction of oxygen (O), carbon (C) or nitrogen (N) in this step may be performed by using any of the following methods, for example.

1. The surface of the Cu layer 34 is heated in a gas such as CO, $CO_2$, $O_2$, $N_2$, or $NO_2$ or in the atmosphere (air) to introduce oxygen (O), carbon (C) or nitrogen (N) to a depth of approximately 100 nm from the surface.
2. Oxygen (O), carbon (C) or nitrogen (N) ions are implanted into the surface of the Cu layer 34 to a depth of approximately 100 nm from the surface.

By using any of these methods, a high-concentration region 34M in which oxygen (O), carbon (C) or nitrogen (N) is introduced is formed in the surface part of the Cu layer 34.

Step 6

Figure 12I:
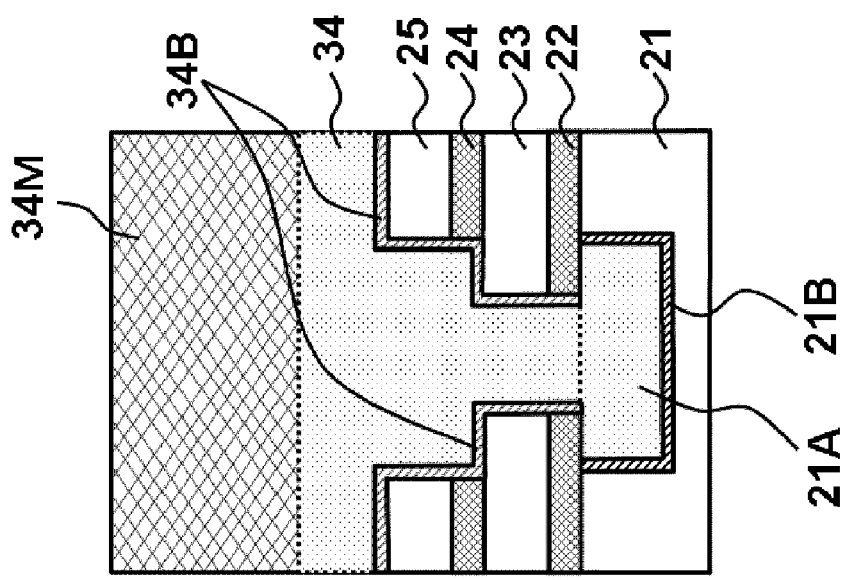
FIGS. 12I and 12J are cross-sectional views (the second series) illustrating process steps of the method for forming the Cu interconnection according to the third exemplary embodiment.

In this step, the substrate on which the high-concentration region 34M has been formed as illustrated in FIG. 12I is heated in the same method as that in the first exemplary embodiment.

Step 7

Figure 12J:
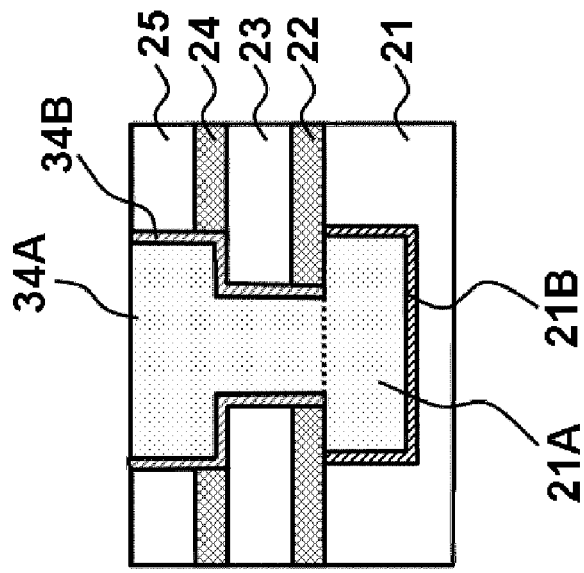

In this step, the high-concentration region 34M of the Cu layer 34 is removed by CMP as illustrated in FIG. 12J in the same way as that in the first exemplary embodiment.

According to the first to third exemplary embodiments, Mn atoms may be efficiently discharged from a Cu interconnect by using the phenomenon in which a significant amount of Mn segregates in a region where oxygen (O), carbon (C) or nitrogen (N) segregates.

The concentration of Mn atoms remaining in any of the interconnects 30A, 32A, 34A formed by any of the first to third exemplary embodiments is approximately 20 to 30% of that in a Cu interconnect formed by a conventional method. For example, the concentration of Mn atoms in an interconnect formed by a conventional method is approximately $4.1 \text{ E} \times 10^{21}$ atoms/cm$^3$. According to the present exemplary embodiments, the concentration of Mn atoms decreases to approximately $1.0 \text{ E} \times 10^{21}$ atoms/cm$^3$.

While the present invention has been described with respect to so-called dual-damascene in which interconnect trenches and via holes are filled with Cu in one CMP step for purposes of illustration, the present invention is also applicable to the single-damascene method in which via holes and interconnect trenches are filled with Cu in separate CMP steps.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device fabrication method, comprising:
    forming an interlayer insulating film on a substrate;
    forming an opening in the interlayer insulating film;
    forming an alloy layer containing manganese and copper to cover the inner surface of the opening;
    forming a first copper layer of a material containing primarily copper on the alloy layer to fill the opening;
    forming, on the first copper layer, a second copper layer of a material containing primarily copper and a higher concentration of oxygen, carbon or nitrogen than the first copper layer;
    heating the substrate on which the second copper layer has been formed; and
    removing the second copper layer.

2. The semiconductor device fabrication method according to claim 1, wherein the first copper layer is formed by electroplating using the alloy layer as a seed layer.

3. The semiconductor device fabrication method according to claim 1, wherein the first and second copper layers are formed by electroplating; and
    the electroplating of the second copper layer is performed at a lower current density than that of the electroplating of the first copper layer.

4. The semiconductor device fabrication method according to claim 1, wherein the second copper layer is formed by chemical vapor deposition using a copper organic compound.

5. The semiconductor device fabrication method according to claim 1, wherein the second copper layer is formed by chemical vapor deposition using Trimethylvinylsilyl hexafluoroacetylacetonate Cu (I) as a source.

6. The semiconductor device fabrication method according to claim 1, wherein the second copper layer is formed by sputtering.

7. The semiconductor device fabrication method according to claim 6, wherein the sputtering is performed in an introduced gas containing oxygen, carbon or nitrogen.

8. The semiconductor device fabrication method according to claim 1, wherein the interlayer insulating film contains silicon and oxygen; and in the step of heating the substrate, a barrier film containing primarily $MnSi_XO_Y$ is formed inside the opening.

9. The semiconductor device fabrication method according to claim 8, wherein in the step of heating the substrate, the substrate is heated at a temperature in the range from 250° C. to 400° C. inclusive.

10. The semiconductor device fabrication method according to claim 8, wherein in the step of heating the substrate, the substrate is heated in an atmosphere of a hydrogen gas, a nitrogen gas, or a argon gas.

11. The semiconductor device fabrication method according to claim 1, wherein the alloy layer is formed by sputtering.

12. The semiconductor device fabrication method according to claim 1, wherein the alloy layer contains 0.1 to 10 atom percent of manganese.

13. The semiconductor device fabrication method according to claim 1, wherein the opening is formed on an interconnect.

14. The semiconductor device fabrication method according to claim 13, wherein the interconnect is made of a material containing primarily copper and a surface oxide is removed from the interconnect prior to the formation of the alloy layer.

15. The semiconductor device fabrication method according to claim 13, wherein a barrier film of a material containing primarily tantalum or tantalum nitride is formed between the interconnect and the interlayer insulating film.

16. A semiconductor device fabrication method, comprising:
    forming an interlayer insulating film on a substrate;
    forming an opening in the interlayer insulating film;
    forming an alloy layer containing manganese and copper to cover the inner surface of the opening;
    forming a first copper layer of a material containing primarily copper on the alloy layer to fill the opening;

introducing oxygen, carbon or nitrogen into a surface of the first copper layer;

after the step of introducing, heating the substrate on which the first copper layer has been formed; and after the step of heating, removing a portion of the first copper layer that is outside the opening.

17. The semiconductor device fabrication method according to claim 16, wherein in the step of introducing oxygen, carbon or nitrogen, ions of oxygen, carbon or nitrogen are implanted into the surface of the first copper layer to introduce the oxygen, carbon, or nitrogen.

18. The semiconductor device fabrication method according to claim 16, wherein in the step of introducing oxygen, carbon or nitrogen, the oxygen, carbon or nitrogen is introduced by heating the substrate while the substrate is exposed to a carbon monoxide gas, a carbon dioxide gas, an oxygen gas, a nitrogen gas, or a nitrogen dioxide gas.

* * * * *